US006791761B2

(12) United States Patent
Shafer et al.

(10) Patent No.: US 6,791,761 B2
(45) Date of Patent: Sep. 14, 2004

(54) OPTICAL PROJECTION LENS SYSTEM

(75) Inventors: David R. Shafer, Fairfield, CT (US); Wilhelm Ulrich, Aalen (DE)

(73) Assignee: Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/393,593

(22) Filed: Mar. 20, 2003

(65) Prior Publication Data

US 2003/0179462 A1 Sep. 25, 2003

Related U.S. Application Data

(63) Continuation of application No. 09/694,878, filed on Oct. 23, 2000, now Pat. No. 6,560,031.
(60) Provisional application No. 60/160,799, filed on Oct. 21, 1999.

(51) Int. Cl.$^7$ ................................................. G02B 3/00
(52) U.S. Cl. ...................... 359/649; 359/754; 359/683
(58) Field of Search ................................. 359/649, 683, 359/690, 754, 785

(56) References Cited

U.S. PATENT DOCUMENTS

| 5,059,006 A | 10/1991 | Kikuchi et al. | 350/426 |
| 5,260,832 A | 11/1993 | Togino et al. | 359/679 |
| 5,398,064 A | 3/1995 | Saka | 348/347 |
| 5,414,561 A | 5/1995 | Wakimoto et al. | 359/663 |
| 5,623,365 A | 4/1997 | Kuba | 359/569 |
| 5,636,000 A | 6/1997 | Ushida et al. | 355/30 |

(List continued on next page.)

FOREIGN PATENT DOCUMENTS

| EP | 1 235 092 A2 | 8/2002 | G02B/13/14 |
| EP | 1 237 043 A2 | 9/2002 | G03F/7/20 |
| EP | 1 245 984 A2 | 10/2002 | G02B/13/14 |
| GB | 1088192 | 10/1967 | G02B/3/04 |
| JP | 10-282411 | 10/1998 | G02B/13/24 |
| JP | 10-325922 | 12/1998 | G02B/13/24 |
| JP | 11-006957 | 1/1999 | G02B/13/24 |
| JP | 11-095095 | 4/1999 | G02B/13/24 |
| JP | 11-214293 | 8/1999 | H01L/21/027 |

OTHER PUBLICATIONS

Bruning, John H. et al., "Optical Lithography—Thirty years and three orders of magnitude, The evolution of optical lithography tools", *SPIE*, vol. 3049, pp. 14–27 (1997).
Buckley, Jere D. et al., "Step and Scan: A systems overview of a new lithography tool", *SPIE*, vol. 1088, pp. 424–433 (1989).
Glatzel, E., "New Developments in Photographic Objectives", *Offprint from Optical Instruments and Techniques*, Oriel Press, pp. 413–415 (1969).
Glatzel, Erhard, "New Lenses for Microlithography", *SPIE*, vol. 237, pp. 310–320 (1980).
Sheats, James R. et al., *Microlithography Science and Technology*, pp. 263–270.
Wöltche, Walter, "Optical Systems Design with Reference to the Evolution of the Double Gauss Lens", *SPIE*, vol. 237, pp. 202–215 (1980).

Primary Examiner—Scott J. Sugarman
Assistant Examiner—M. Hasan

(57) ABSTRACT

An optical projection lens system for microlithography comprising in the direction of propagating radiation: a first lens group having positive refractive power, a second lens group having negative refractive power and comprising a waist (constriction) with a minimum diameter of the propagating radiation, and a further lens arrangement with positive refractive power, which follows the second lens group, wherein at least one lens of the projection lens system which is arranged in front of the waist comprises an aspherical surface.

75 Claims, 1 Drawing Sheet

U.S. PATENT DOCUMENTS

| | | | |
|---|---|---|---|
| 5,696,631 A | 12/1997 | Hoffman | 359/649 |
| 5,856,884 A | 1/1999 | Mercado | 359/649 |
| 5,969,803 A | 10/1999 | Mercado | 355/67 |
| 5,986,824 A | 11/1999 | Mercado | 359/754 |
| 5,990,926 A | 11/1999 | Mercado | 347/258 |
| 6,008,884 A | 12/1999 | Yamaguchi et al. | 355/53.54 |
| 6,084,723 A | 7/2000 | Matsuzawa et al. | 359/754 |
| 6,088,171 A | 7/2000 | Kudo | 359/754 |
| 6,166,865 A | 12/2000 | Matsuyama | 359/690 |
| 6,185,050 B1 | 2/2001 | Ota et al. | 359/691 |
| 6,198,576 B1 * | 3/2001 | Matsuyama | 359/649 |
| 6,259,508 B1 | 7/2001 | Shigematsu | 355/53 |
| 6,259,569 B1 | 7/2001 | Kasai | 259/690 |
| 6,349,005 B1 * | 2/2002 | Schuster et al. | 359/649 |
| 6,377,338 B1 | 4/2002 | Suenaga | 355/67 |
| 6,512,633 B2 | 1/2003 | Konno et al. | 359/557 |
| 6,538,821 B2 | 3/2003 | Takahashi | 359/649 |
| 6,560,031 B1 | 5/2003 | Shafer et al. | 359/649 |
| 6,606,144 B1 | 8/2003 | Omura | 355/67 |
| 6,674,513 B2 | 1/2004 | Omura | 355/67 |
| 2003/0086183 A1 * | 5/2003 | Wagner et al. | 359/649 |

* cited by examiner

OPTICAL PROJECTION LENS SYSTEM

CROSS-REFERENCES TO RELATED APPLICATIONS

This is a Continuation of U.S. patent application Ser. No. 09/694,878 filed Oct. 23, 2000 now U.S. Pat. No. 6,560,031, which claims the benefit of provisional application ser No. 60/160,799 filed Oct. 21, 1999.

STATEMENT REGARDING FEDERALLY SPONSORED RESEARCH OR DEVELOPMENT

Not applicable.

BACKGROUND OF THE INVENTION

This invention generally relates to an optical projection system comprising a light source, a mask holder, a projection lens system, and specifically relates to an optical projection system for photolithography used in producing microstructured devices, i.e., microlithography, such as integrated circuits or other semiconductor devices. During the fabrication of such devices, photolithography transfers an image from a photographic mask to a resultant pattern on a semiconductor wafer. Such photolithography generally includes a light exposure process, in which a semiconductor wafer is exposed to light having information of a mask pattern. Optical projection systems are used to perform the light exposure process.

In general, the transferred mask patterns are very fine, so that optical projection lens systems are required to have a high resolution. The high resolution necessitates a large numerical aperture of the optical projection lens system and also nearly no aberration of the optical projection lens system in the light exposure field.

For example, some projection lens systems are proposed in the German Patent Application DE 198 18 444 A1. The shown projection lens system comprises 6 lens groups. The first, third, fifth and sixth lens groups have positive refractive power and the second and fourth lens groups have negative refractive power. To get a high resolution in all shown examples, aspherical surfaces are in the fourth and fifth lens groups.

Some purely refractive projection exposure objectives of microlithography are discussed in SPIE Vol. 237 (1980), page 310 ff. There are shown objectives of the planar style and the distagon style, wherein the new style of objective comprises two waists for setzval correction.

SUMMARY OF THE INVENTION

It is an object of this invention to provide a further excellent optical projection lens system for photolithography.

The optical projection lens system of the invention comprises in a direction of the light (propagating radiation) a first lens group having positive refractive power and a second lens group having negative refractive power and establishing a beam waist (i.e., constriction) of minimal beam height. A further lens arrangement follows the second lens group. At least one lens, which is arranged before the first beam waist, has an aspherical surface. Further, lenses comprising aspherical surfaces in all other groups will be helpful to reduce the needed amount of material and to reduce the length of the optical projection lens system.

DETAILED DESCRIPTION OF THE INVENTION

Figure 1:
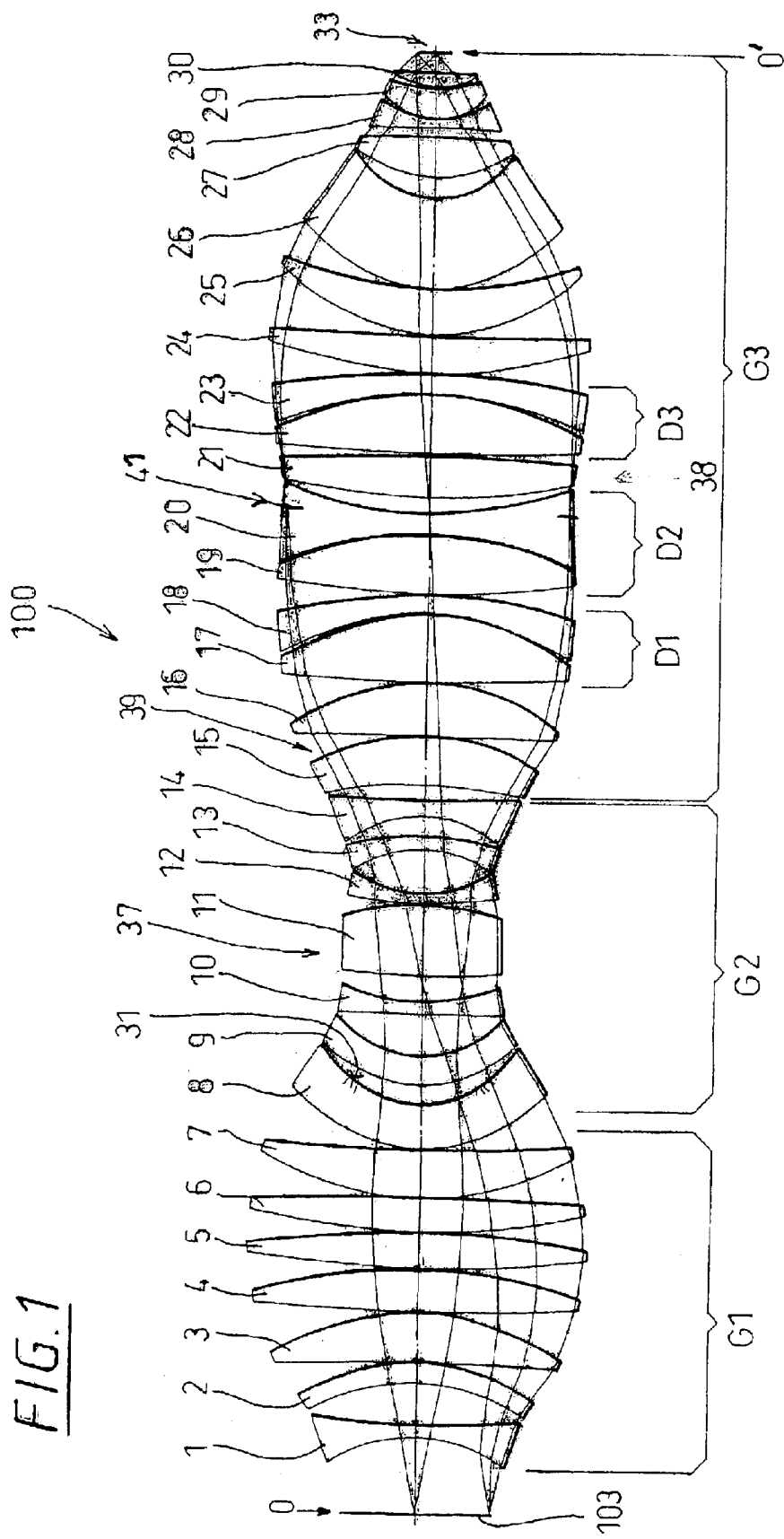
FIG. 1 is a cross section of an optical projection lens system according to an embodiment of the invention with only one clearly defined waist (i.e., constriction).

The optical projection lens system, shown in FIG. 1 comprises 30 lenses 1–30. This shown projection lens system is for wafer manufacture (i.e., a microlithography system). For illuminating a mask 103, which is positioned at 0, a light source with a narrow bandwidth is used. In this example, an excimer laser, which is not shown in the drawing, is used. The shown projection lens system is capable of being operated at 193.3 nm with a high numerical aperture of 0.7. This projection lens system is also adaptable to be operated at λ=248 m or λ 157 nm.

A projection system comprising with this projection lens system the scale of the mask 103 projected on a wafer is reduced, wherein the wafer is positioned on 0'. The factor of scale reduction is 4 and the distance of 0' to 0' is 1000 mm. The illuminated image field is rectangular, e.g. 7.times.20.to 15.times.30 mm$^2$.

The present invention will be more fully understood from the detailed description given below and the accompanying drawing.

In the direction of propagating radiation, this projection lens system comprises a first lens group G1 comprising lenses 1 to 7 and a second lens group G2 comprising lenses 8 to 14, and a further lens arrangement G3 comprising lenses 15 to 30. The first lens group G1, has positive refractive power and ends with a lens 7 of refractive power.

The first lens 8 of the second lens group G2 is the first lens 8 behind the first belly of the projection lens system 100, which has a concave shaped lens surface 31 on the image side. In the example shown, this concave surface 31 has an aspherical shape. This aspherical surface 31 helps to reduce the track length, the number of needed lenses and helps to get a high image quality over the whole illuminated image field.

This second lens group G2 has negative refractive power and comprises a clearly defined waist portion (i.e., constriction) 37, which comprises seven lenses. The high number of lenses are needed for petzval correction, because there is only one clearly defined waist. There are three negative lenses 8–10 arranged in front of a lens 11 of positive refractive power in the middle of the lens group G2. Behind this positive lens 11 there are three further negative lenses 12–15.

The first lens 15 of the following lens arrangement G3 has positive refractive power. This is the first lens 15 of positive refractive power behind the lens 11 in the middle of the lens group G2. This lens arrangement G3 has positive refractive power and comprises lenses 15–30 of different materials and an aperture stop 41.

CaF$_2$ lenses 16, 17, 19, 21, 22, 29 and 30 are especially used. The other lenses are of quartz glass. These CaF$_2$ lenses are especially used for correction of chromatic aberration. This system comprises doublets D1, D2 and D3, which comprise a CaF$_2$ lens with positive refractive power followed by a quartz glass lens of negative refractive power. If no correction of chromatic aberration is required, as is usual in 248 nm systems, or possible with very narrow laser bandwidth, single lenses of the doublets D1–D3 can be taken, with the advantage of reducing the needed material and lenses.

A very shallow waist 38 is recognizable between lens 20 and lens 21.

The lens arrangement G3 has a maximum diameter of 238 mm.

The lens data of this embodiment are listed in the following Table 1. The aspheric surface is described mathematically by:

$$P(h) = \frac{\delta * h^2}{1 + \sqrt{(1-(1-EX)*\delta*h^2)}} + C_1 h^4 + \ldots + C_n h^{2n-2}$$

with $\delta = 1/R$, wherein R is paraxial curvature and P is the sag as a function of the radius h.

TABLE 1

| LENS | RADIUS | THICKNESS | GLASS |
|---|---|---|---|
| | UNENDL | 17.52 | |
| L1 | −116.39 | 10.00 | $SiO_2$ |
| | 617.53 | 31.49 | |
| L2 | −143.96 | 15.00 | $SiO_2$ |
| | −158.71 | 0.50 | |
| L3 | −1180.69 | 37.72 | $SiO_2$ |
| | −191.12 | 0.50 | |
| L4 | 2484.02 | 31.18 | $SiO_2$ |
| | −409.87 | 0.50 | |
| L5 | 864.05 | 28.13 | $SiO_2$ |
| | −720.08 | 0.50 | |
| L6 | 566.89 | 25.00 | $SiO_2$ |
| | −5256.53 | 0.50 | |
| L7 | 230.42 | 36.66 | $SiO_2$ |
| | 1542.90 | 0.50 | |
| L8 | 132.99 | 31.60 | $SiO_2$ |
| | 84.39 | 12.54 | |
| L9 | 101.03 | 22.70 | $SiO_2$ |
| | 80.07 | 30.80 | |
| L10 | −7281.27 | 10.00 | $SiO_2$ |
| | 139.12 | 20.25 | |
| L11 | 962.49 | 53.36 | $SiO_2$ |
| | −190.49 | 0.50 | |
| L12 | 348.09 | 9.00 | $SiO_2$ |
| | 96.42 | 32.28 | |
| L13 | −94.72 | 11.00 | $SiO_2$ |
| | −203.97 | 14.37 | |
| L14 | −91.49 | 13.00 | $SiO_2$ |
| | 4787.89 | 10.28 | |
| L15 | −329.06 | 36.69 | $SiO_2$ |
| | −173.40 | 0.50 | |
| L16 | −2176.02 | 40.00 | $CaF_2$ |
| | −161.94 | 1.00 | |
| L17 | 1885.09 | 50.00 | $CaF_2$ |
| | −195.36 | 0.48 | |
| L18 | −198.97 | 15.00 | $SiO_2$ |
| | −389.14 | 0.50 | |
| L19 | 687.29 | 45.10 | $CaF_2$ |
| | −254.11 | 0.10 | |
| L20 | −261.96 | 15.00 | $SiO_2$ |
| | 261.17 | 13.27 | |
| L21 | 530.40 | 32.00 | $CaF_2$ |
| | −1166.11 | 0.50 | |
| L22 | 1879.17 | 45.00 | $CaF_2$ |
| | −237.88 | 0.10 | |
| L23 | −271.21 | 15.00 | $SiO_2$ |
| | −609.73 | 0.50 | |
| L24 | 351.48 | 30.00 | $SiO_2$ |
| | 100200.00 | 0.50 | |
| L25 | 157.95 | 34.26 | $SiO_2$ |
| | 329.33 | 0.50 | |
| L26 | 125.26 | 67.46 | $SiO_2$ |
| | 69.91 | 16.27 | |
| L27 | 102.35 | 30.27 | $SiO_2$ |
| | −1072.95 | 7.25 | |
| L28 | −914.82 | 5.00 | $SiO_2$ |
| | 63.74 | 0.50 | |
| L29 | 53.45 | 23.33 | $CaF_2$ |
| | 82.67 | 0.50 | |
| L30 | 60.16 | 10.70 | $CaF_2$ |
| | 1256.42 | 15.34 | |

Aspheric Constants
EX = 0.139140 * $10^{-8}$
$C_1$ = 0.178710 * 10--12-
$C_2$ = 0.601290 * $10^{-17}$
$C_3$ = 0.253200 * $10^{-20}$ The maximum beam diameter is 238 mm ad the track length is 1000 mm, wherein the numerical aperture is NA=0.7. This results in a very compact construction with reduced cost for lens material.

The implementation of $CaF_2$ lenses 16, 17, 19, 21, 22 effects a good correction of chromatic aberration of this compact embodiment. The last two $CaF_2$ lenses 29, 30 at the end of the lens arrangement G3 are inserted for their resistance versus compaction.

As those skilled in the art of optical projection lens systems will readily appreciate, numerous substitutions, modifications and additions may me made to the above design without departing from the spirit and scope of the present invention. It is intended that all such substitutions, modifications, and additions fall within the scope of the invention, which is defined by the claims.

We claim:

1. Apparatus comprising:
   a microlithography optical projection lens system comprising from an object side to an image side:
      a first lens group having positive refractive power,
      a second lens group having negative refractive power and comprising a constriction portion where rays propagating from the object side to the image side have a minimum diameter, and
      a further lens arrangement with positive refractive power, which follows said second lens group,
   wherein at least one lens which comprises an aspherical surface is arranged in front of said constriction portion,
   wherein a numerical aperture on an image side of the microlithography optical projection lens system is greater than 0.65, and
   wherein the microlithography optical projection lens system comprises only one clearly defined constriction portion.

2. The apparatus of claim 1, wherein only said second lens group comprises an aspherical surface.

3. The apparatus of claim 1, wherein said further lens arrangement comprises a second shallow constriction portion.

4. The apparatus of claim 1, wherein said lens comprising an aspherical surface comprises a meniscus shaped lens.

5. The apparatus of claim 1, wherein said numerical aperture is 0.7 or more.

6. The apparatus of claim 1, comprising at least three $CaF_2$ lenses which are biconvex lenses.

7. The apparatus of claim 1, wherein a last lens element is a $CaF_2$ lens.

8. The apparatus of claim 1,
   wherein said aspherical surface is a concave surface.

9. Apparatus comprising:
   a microlithography optical projection lens system comprising from an object side to an image side:
      a first lens group having positive refractive power,
      a second lens group having negative refractive power and comprising a constriction portion where rays propagating from the object side to the image side have a minimum diameter, and
      a further lens arrangement with positive refracting power, which follows said second lens group,
   wherein at least one lens which comprises an aspherical surface is arranged in front of said constriction portion,
   wherein said microlithography optical projection lens system comprises only one clearly defined constriction portion and has a numerical aperture greater than 0.65, and wherein an excimer laser is used as a light source emitting radiation of 250 nm or shorter wavelength.

10. The apparatus of claim 8, wherein said concave surface is arranged at the image side of said at least one lens.

11. The apparatus of claim 9, wherein only said second lens group comprises an aspherical surface.

12. The apparatus of claim 9, wherein said further lens arrangement comprises a second shallow constriction portion.

13. The apparatus of claim 9, wherein said lens comprising an aspherical surface comprises a meniscus shaped lens.

14. The apparatus of claim 9, wherein said numerical aperture is 0.7 or more.

15. The apparatus of claim 9, comprising at least three $CaF_2$ lenses which are bi-convex lenses.

16. The apparatus of claim 9, wherein a last lens element is a $CaF_2$ lens.

17. Apparatus comprising:
a microlithography optical projection lens system comprising from an object side to an image side:
a first lens group having positive refractive power,
a second lens group having negative refractive power and comprising a constriction portion where rays propagating from the object side to the image side have a minimum diameter, and
a further lens arrangement with positive refractive power, which follows said second lens group,
wherein at least one lens comprising an aspherical surface is arranged in front of said constriction portion,
wherein said microlithography optical projection lens system provides a reduced imaging of an object into an image with an imaging ratio of 1:4, and
wherein said microlithography optical projection lens system comprises only one clearly defined constriction portion and has a numerical aperture of 0.7 or more.

18. The apparatus of claim 17, wherein only said second lens group comprises an aspherical surface.

19. The apparatus of claim 17, wherein said further lens arrangement comprises a second shallow constriction portion.

20. The apparatus of claim 17, wherein said lens comprising an aspherical surface comprises a meniscus shaped lens.

21. The apparatus of claim 17, comprising at least three $CaF_2$ lenses which are bi-convex lenses.

22. The apparatus of claim 17, wherein a last lens element is a $CaF_2$ lens.

23. The apparatus of claim 17, wherein an excimer laser is used as light source emitting radiation of 250 nm or shorter wavelength.

24. Apparatus comprising:
a microlithography optical projection lens system comprising from an object side to an image side:
a first lens group having positive refractive power,
a second lens group having negative refractive power and comprising a constriction portion where rays propagating from the object side to the image side have a minimum diameter, and
a further lens arrangement with positive refractive power, which follows said second lens group,
wherein at least one lens comprising an aspherical surface is arranged in front of said constriction portion,
wherein said first lens group comprises a first lens with negative refractive power, and
wherein said microlithography optical projection lens system comprises only one clearly defined constriction portion and has a numerical aperture greater than 0.65.

25. The apparatus of claim 24, wherein said first lens group has a second lens with a concave surface on the side directed toward said object.

26. The apparatus of claim 25, said first lens group further comprising at least four lenses having positive refractive power.

27. The apparatus of claim 26, wherein at least two of said at least four lenses are biconvex lenses.

28. The apparatus of claim 24, wherein only said second lens group comprises an aspherical surface.

29. The apparatus of claim 24, wherein said further lens arrangement comprises a second shallow constriction portion.

30. The apparatus of claim 24, wherein said lens comprising an aspherical surface comprises a meniscus shaped lens.

31. The apparatus of claim 24, wherein said numerical aperture is 0.7 or more.

32. The apparatus of claim 24, comprising at least three $CaF_2$ lenses which are bi-convex lenses.

33. The apparatus of claim 24, wherein a last lens element is a $CaF_2$ lens.

34. The apparatus of claim 24, wherein an excimer laser is used as light source emitting radiation of 250 nm or shorter wavelength.

35. Apparatus comprising:
a microlithography optical projection lens system comprising from an object side to an image side:
a first lens group having positive refractive power,
a second lens group having negative refractive power and comprising a constriction portion where rays propagating from the object side to the image side have a minimum diameter, and
a further lens arrangement with positive refractive power, which follows said second lens group,
wherein at least one lens comprising an aspherical surface is arranged in front of said constriction portion,
wherein said second lens group having at least two lenses with negative refractive power is arranged in front of said constriction portion, and
wherein said microlithography projection lens system comprises only one clearly defined constriction portion and has a numerical aperture greater than 0.65.

36. The apparatus of claim 35, wherein said at least two lenses with negative refractive power are meniscus lenses with a concave surface directed to said image side.

37. The apparatus of claim 35, wherein said second lens group comprises a lens having positive refractive power following said at least two lenses with negative refractive power.

38. The apparatus of claim 37, wherein said second lens group comprises at least two further negative lenses having negative refractive power following said lens having positive refractive power.

39. The apparatus of claim 35, wherein said second lens group has a last lens that is biconcave.

40. The apparatus of claim 35, wherein only said second lens group comprises an aspherical surface.

41. The apparatus of claim 35, wherein said further lens arrangement comprises a second shallow constriction portion.

42. The apparatus of claim 35, wherein said lens comprising an aspherical surface comprises a meniscus shaped lens.

43. The apparatus of claim 35, wherein said numerical aperture is 0.7 or more.

44. The apparatus of claim 35, comprising as least three $CaF_2$ lenses which are bi-convex lenses.

45. The apparatus of claim 35, wherein a last lens element is a CaF$_2$ lens.

46. The apparatus of claim 35, wherein an excimer laser is used as light source emitting radiation of 250 nm or shorter wavelength.

47. Apparatus comprising:
a microlithography optical projection lens system comprising from an object side to an image side:
a first lens group having positive refractive power,
a second lens group having negative refractive power and comprising a constriction portion where rays propagating from the object side to the image side have a minimum diameter, and
a further lens arrangement with positive refractive power, which follows said second lens group;
wherein at least one lens comprising an aspherical surface is arranged in front of said constriction portion, and wherein said further lens arrangement comprises an aperture stop,
said further lens arrangement further comprises a lens having negative refractive power being arranged in the immediate neighborhood of said aperture stop and having a concave surface directed to said image side,
said further lens arrangement further comprising a biconvex lens following said lens having negative refractive power, and
wherein said microlithography optical projection lens system comprises only one clearly defined constriction portion and has a numerical aperture greater than 0.65.

48. The apparatus of claim 47, wherein only said second lens group comprises an aspherical surface.

49. The apparatus of claim 47, wherein said further lens arrangement comprises a second shallow constriction portion.

50. The apparatus of claim 47, wherein said lens comprising an aspherical surface comprises a meniscus shaped lens.

51. The apparatus of claim 47, comprising at least three CaF$_2$ lenses which are bi-convex lenses.

52. The apparatus of claim 47, wherein a last lens element is a CaF$_2$ lens.

53. The apparatus of claim 47, wherein an excimer laser is used as light source emitting radiation of 250 nm or shorter wavelength.

54. Apparatus comprising:
a microlithography optical projection lens system comprising from an object side to an image side:
a first lens group having positive refractive power,
a second lens group having negative refractive power and comprising a constriction portion where rays propagating from the object side to the image side have a minimum diameter, and
a further lens arrangement with positive refractive power, which follows said second lens group,
wherein said microlithography optical projection lens system comprises only one clearly defined constriction portion and has a numerical aperture greater than 0.65, and
said microlithography optical projection lens has a maximal optically free diameter greater than 0.2 times a distance from an object side object plane and an image side image plane into which said object plane is imaged by said optical projection lens.

55. The apparatus of claim 54, wherein said further lens arrangement has an aperture diaphragm,
said further lens arrangement further having a lens with negative refractive power following said aperture diaphragm, which has a diameter of at least 0.9 times said maximal optically free diameter.

56. The apparatus of claim 55, said diaphragm having a diameter of between 0.95 and 1.05 of said maximal optically free diameter.

57. The apparatus of claim 54, said further lens arrangement comprising three lenses having positive refractive power between a last lens with negative optical power of said second lens group and a first lens with negative refractive power in the further lens arrangement.

58. The apparatus of claim 54, said second lens group comprising four lenses with negative refractive power and a meniscus in front of a first one of said four lenses with negative refractive power, said meniscus having a concave surface on said image side.

59. The apparatus of claim 54, said first lens group comprising five lenses with positive refractive power.

60. The apparatus of claim 54, said lens having an image side working distance smaller than 0.115 times the distance between an object side object plane and an image side image plane into which said object plane is imaged by said optical projection lens.

61. The apparatus of claim 54, wherein said first lens group has a first, a second, a third, a fourth, a fifth, a sixth, a seventh, an eighth, a ninth, a tenth, an eleventh, and a twelfth lens surface, and wherein said sixth, eighth, and tenth lens surfaces have positive surface refractive power.

62. The apparatus of claim 61, wherein additionally, the twelfth lens surface has positive surface refractive power.

63. The apparatus of claim 62, wherein said fifth lens surface has negative surface refractive power.

64. The apparatus of claim 54, wherein said second lens group comprises an aspherical surface.

65. The apparatus of claim 54, wherein said further lens arrangement comprises a second shallow constriction portion.

66. The apparatus of claim 64, wherein said lens comprising an aspherical surface comprises a meniscus shaped lens.

67. The apparatus of claim 54, wherein said numerical aperture is 0.7 or more.

68. The apparatus of claim 54, comprising at least three CaF$_2$ lenses which are bi-convex lenses.

69. The apparatus of claim 54, wherein a last lens element is a CaF$_2$ lens.

70. The apparatus of claim 54, wherein an excimer laser is used as light source emitting radiation of 250 nm or shorter wavelength.

71. A microlithography process for producing microstructured devices, comprising:
exposing a wafer with a light sensitive layer with UV-light of an excimer laser using an optical projection lens system,
using a mask for defining the structure of the device, and
developing said light sensitive layer to obtain the microstructured device,
wherein said optical projection lens system comprises a lens group with negative refractive power and a constriction portion where rays propagating from the object side to the image side have a minimum diameter,
wherein said optical projection lens system comprises only one clearly defined constriction portion,
wherein said optical projection lens system has a numerical aperture greater than 0.7 and comprises at least one aspherical surface.

72. A microlithography process for producing microstructured devices, comprising:

exposing a wafer with a light sensitive layer with UV-light with an excimer laser using an optical projection lens system, using a mask for defining a structure of the device, and developing said light sensitive layer to obtain the microstructured device, wherein said projection lens system comprises a lens group with negative refractive power and a constriction portion where rays propagating from the object side to the image side have a minimum diameter, wherein said optical projection lens system comprises only one clearly defined constriction portion, wherein said optical projection lens system has a numerical aperture greater than 0.65, and wherein said optical projection lens system comprises a reduced imaging of an object into an image with an imaging ratio of 1:4.

73. A microlithography process for producing microstructured devices, comprising:

exposing a wafer with a light sensitive layer with UV-light of an excimer laser using an optical projection lens system, using a mask for defining the structure of the device, and developing said light sensitive layer to obtain the microstructured device, wherein said optical projection lens system comprises a first lens group with positive refractive power and a second lens group with negative refractive power and a constriction portion where rays propagating from the object side to the image side have a minimum diameter, wherein said optical projection lens system comprises only one clearly defined constriction portion, wherein said optical projection lens system has a numerical aperture greater than 0.65, and wherein said first lens group has a first lens with negative refractive power.

74. A microlithography process for producing microstructured devices, comprising:

exposing a wafer with a light sensitive layer with UV-light of an excimer laser using an optical projection lens system, using a mask for defining the structure of the device, and developing said light sensitive layer to obtain the microstructured device, wherein said optical projection lens system comprises a first lens group with positive refractive power and a second lens group with negative refractive power and a constriction portion where rays propagating from the object side to the image side have a minimum diameter, wherein said optical projection lens system comprises only one clearly defined constriction portion, wherein said optical projection lens system has a numerical aperture greater than 0.65, and said second lens group has at least two lenses with negative refractive power in front of said constriction portion.

75. A microlithography process for producing microstructured devices comprising:

exposing a wafer with a light sensitive layer with UV-light of an excimer laser using an optical projection lens system, using a mask for defining the structure of the device, and developing said light sensitive layer to obtain the microstructured device, wherein said optical projection lens system comprises a first lens group with positive refractive power and a second lens group with negative refractive power and a constriction portion where rays propagating from the object side to the image side have a minimum diameter, wherein said optical projection lens system comprises only one clearly defined constriction portion, wherein said optical projection lens system has a numerical aperture greater than 0.65, and wherein said further lens arrangement comprises an aperture stop, said further lens arrangement further comprising a lens having negative refractive power that is arranged in an immediate neighborhood of said aperture stop and has a concave surface directed to said image side, and said further lens arrangement further comprises a biconvex lens following said lens having negative refractive power.

* * * * *

UNITED STATES PATENT AND TRADEMARK OFFICE
CERTIFICATE OF CORRECTION

PATENT NO. : 6,791,761 B2
APPLICATION NO. : 10/393593
DATED : September 14, 2004
INVENTOR(S) : David R. Shafer and Wilhelm Ulrich It is certified that error appears in the above-identified patent and that said Letters Patent is hereby corrected as shown below:

Column 2, line 12, change "248 m" to -- 248 nm --; line 12, change "λ 157" to -- λ = 157 --; line 17, change "distance of 0' to 0'" to -- distance of 0 to 0' --; line 17, change "7.times.20.to" to -- 7 × 20 to --; line 18, change "15.times.30" to -- 15 × 30 --.

Column 3, line 72, change "$C_1 = 0.178710 * 10$--12-" to -- $C_1 = 0.178710 * 10^{-12}$ --.

Column 4, line 1, change "ad" to -- and --; line 12, change "me" to -- be --.

Column 6, line 41, change "microlithography projection" to -- microlithography optical projection --.

Signed and Sealed this

Ninth Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 6,791,761 B2  Page 1 of 1
APPLICATION NO. : 10/393593
DATED : September 14, 2004
INVENTOR(S) : David R. Shafer and Wilhelm Ulrich It is certified that error appears in the above-identified patent and that said Letters Patent is hereby corrected as shown below:

Title page, item (73), change "Zeiss SMT AG" to -- Carl Zeiss SMT AG --.

Signed and Sealed this

Nineteenth Day of August, 2008

JON W. DUDAS
*Director of the United States Patent and Trademark Office*